United States Patent [19]

Evans

[11] Patent Number: 4,811,195
[45] Date of Patent: Mar. 7, 1989

[54] ELECTRONIC CONTROL SYSTEM WITH IMPROVED COMMUNICATIONS

[75] Inventor: Don M. Evans, San Ramon, Calif.

[73] Assignee: ASI Controls, San Ramon, Calif.

[21] Appl. No.: 21,673

[22] Filed: Mar. 4, 1987

[51] Int. Cl.⁴ .......................... G05B 23/02; H04B 3/36
[52] U.S. Cl. .................................. 364/133; 364/900;
364/138; 340/825.05; 370/29; 375/3
[58] Field of Search ............ 340/825.05, 825.09,
340/425; 375/3; 379/347, 345; 370/29, 31;
364/131, 132, 133, 138, 184, 187, 200, 900;
165/22

[56] References Cited

U.S. PATENT DOCUMENTS

| | | |
|---|---|---|
| 3,967,059 | 6/1976 | Moore, III et al. ................ 370/31 |
| 4,154,978 | 5/1979 | Tu ............................................ 370/31 |
| 4,217,646 | 8/1980 | Caltaginone et al. ............. 364/900 |
| 4,476,558 | 10/1984 | Amon ...................................... 370/29 |
| 4,500,951 | 2/1985 | Sugimoto et al. .................. 364/186 |
| 4,517,637 | 5/1985 | Cassell ................................. 364/138 |
| 4,542,479 | 9/1985 | Kamimura et al. ................ 364/900 |
| 4,567,557 | 1/1986 | Burns ................................... 364/138 |
| 4,598,410 | 7/1986 | Smith et al. ............................. 375/3 |
| 4,622,551 | 11/1986 | Kupersmith et al. ................. 370/31 |
| 4,633,246 | 12/1986 | Jones et al. ...................... 340/825.05 |
| 4,670,886 | 6/1987 | Newcombe, Jr. et al. ............. 375/3 |

*Primary Examiner*—John R. Lastova
*Attorney, Agent, or Firm*—Limbach, Limbach & Sutton

[57] ABSTRACT

An electronic control system and an electronic control are disclosed. The electronic control system comprises a plurality of electronic controls communicating in a half-duplex mode. Each of the electronic controls has a computer with a store program and communicates with other electronic controls and with a host computer only in the event one of the parameters in the store program exceeds its pre-set range. Further, the electronic control system has a repeater which controls the half-duplex communication mechanism to achieve a 100% duty cycle. Finally, a programmable gain and offset circuit is disclosed.

6 Claims, 5 Drawing Sheets

ELECTRONIC CONTROL SYSTEM WITH IMPROVED COMMUNICATIONS

This application is submitted with a microfiche Appendix (Exhibit A), consisting of 2 microfiches and 149 frames.

TECHNICAL FIELD

The present invention relates to an improved electronic control system, which comprises a plurality of like electronic controls with communication links therebetween, and also to the electronic control and a programmable gain and offset circuit used therein. The present invention relates more particularly to an electronic control system having like units communicating with one another in a half-duplex mode and is adapted to receive analog input signals and to produce digital control output signals.

BACKGROUND OF THE INVENTION

Electronic controls are well-known in the art. Typically, electronic controls receive analog input signals and produce digital output control signals. These controls are used to control various apparatuses. One such application is in the control of temperature of a zone or a room in a building. A control can be used to detect the temperature and air flow, and is adapted to control motors for fans to circulate the air and to open or close the dampers which circulate the air.

Electronic communication between like controls is also well-known in the art. One such well-known technique of communication is known as the half-duplex mode of communication. In such a communication scheme, one unit, and only one unit, can transmit at a time. To ensure that the transmission of data by a second unit does not begin prematurely while the first unit has not completely terminated its transmission, typical prior art apparatus has used passive RC circuits to determine the end of transmission of one unit, to wait a period of time prior to permitting the second unit to commence its transmission. In such an environment, the communication protocol is not operating in 100% duty cycle.

Programmable gain and offset circuits are also well-known in the art. However, heretofore, a programmable gain and offset circuit has been complete and expensive to make.

SUMMARY OF THE INVENTION

In the present invention, an electronic control system for controlling a plurality of remotely located apparatuses is disclosed. The electronic control system has a plurality of like electronic controls with each control having a computer means with a stored program. The stored program has a plurality of parameters, each with a pre-set range. Each of the controls receives an input signal and provides an output control signal for controlling one of the apparatuses independent of the other controls and apparatuses. A communication link links each control to other controls for communication in a half-duplex mode. Each of the controls has means for communicating to other controls only in the event one of the parameters exceeds its pre-set range.

In another embodiment of the electronic control system of the present invention, the control system has means for controlling the communication link to operate with 100% duty cycle.

An electronic repeater which controls the communication between various digital electronic devices communication in a half-duplex mode is also disclosed. The repeater has a first receiver means for receiving a first signal from one of the digital devices and provides a first received signal. A first gate means receives the first received signal and a first control signal and provides a first output signal. A first driver means receives the first output signal and provides a first transmitted signal to the other digital devices. A second receiver means receives a second signal from another digital device and provides a second received signal. A second gate means receives the second received signal and a second control signal and provides a second output signal. A second driver means receives the second output signal and provides a second transmitted signal to other digital devices. Means for determining the end of transmission of the first or the second signal is also provided. Means for generating the first and second control signals is also provided. The generating means is responsive to the determining means for detecting the end of transmission. Means for enabling the first and second receiver means is also provided. Finally, means for enabling the first or second means in response to the first or second signal received is provided.

A programmable gain and offset circuit which receives a plurality of analog input signals and provides an output signal is also disclosed. The circuit has an amplified means having a first input, a second input and an output. A multiplexer means selects one of the analog input signals and supplies that selected analog input signal to the first input of the amplifier means. Means for generating an offset signal is provided. A plurality of serially connected resistive means with a plurality of nodes with each node between a pair of adjacent resistive means is also provided. A plurality of electronic switch means with each switch means interconnecting a node to the second input of the amplifier means is provided. One end of the serially-connected resistive means is connected to the output of the amplifier means. An offset switch means interconnects the offset signal generating means to the other end of the serially-connected resistive means.

DETAILED DESCRIPTION OF THE DRAWINGS

Figure 1:
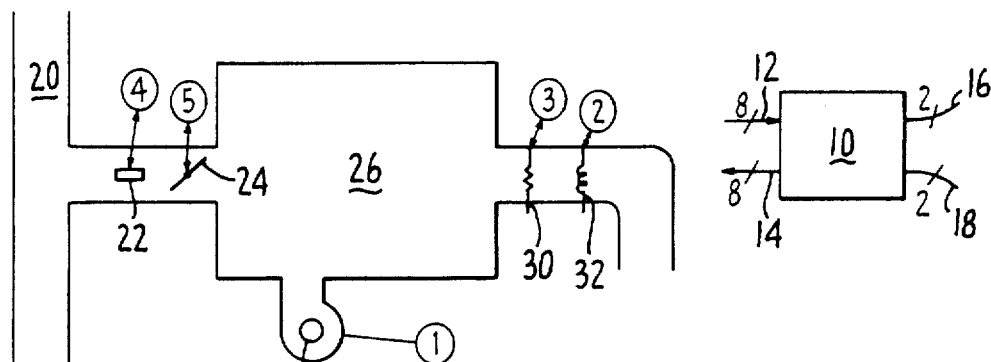
FIG. 1 is a schematic block diagram showing the electronic control of the present invention for use in controlling a portion of a building, such as a zone or an office
Figure 2:
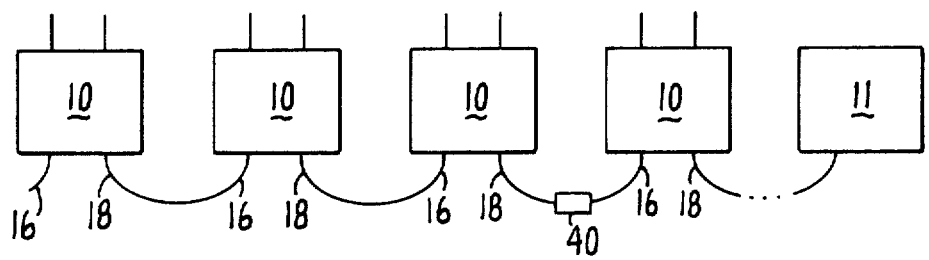
FIG. 2 is schematic block diagram of the electronic control system of the present invention, comprising a plurality of like electronic controls with communication links established therebetween.

Referring to FIG. 1, there is shown a schematic diagram of an electronic control 10 of the present invention. The electronic control 10 is adapted to receive eight analog input signals 12, and is adapted to produce eight digital output control signals 14. The control 10 is also adapted to receive communications along an input communication link 16 and to provide output communication along the output communication link 18.

The electronic control 10 is adapted to be used to control one or more remotely located apparatuses. One typical application is in the control of a zone 26 or a room 26 in a building. Shown in FIG. 1 are various signals which are adapted to be received by the electronic control 10 and various apparatuses which are adapted to be controlled by the electronic control 10. For example, of the zone or office has a main air duct 20, an air duct sensor 22 provides one of the input signals 12. A motorized damper 24 controls the amount of air which is permitted to enter into the room or zone 26. The motorized damper 24 can be controlled by one of the output digital control signals 14 from the electronic control 10. Another apparatus which can be controlled by the electronic control 10 is a motorized fan 28 to circulate the air within the room or zone 26. Finally, an electric heater 30 or a hot water heater 32 may be controlled by the electronic control 10.

It should be noted that the electronic control 10 is adapted to control one or more remotely located apparatuses independent of other controls and apparatuses in the building. Thus, as will be discussed hereinafter, each of the electronic controls 10 comprises a computer means 46 and a stored program to control the apparatuses which are assigned to that electronic control 10.

Figure 3:
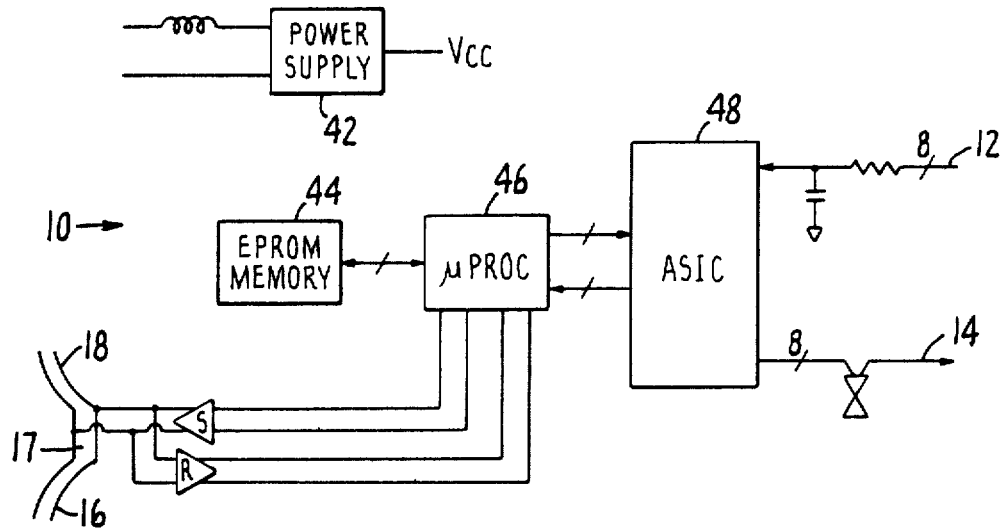
FIG. 3 is a block schematic diagram in greater detail showing the electronic control of the present invention.

To integrate all of the electronic controls 10 that are controlling the various remotely located aparatuses, the electronic controls 10 are linked to one another by a communication link. Each of the controls 10, as previously discussed, has an input communication link 16 and an output communication link 18. The communication links are all connected one to another. That is, the output communication link 18 of one electronic control 10 provides the input to an adjacent electronic control 10 via its input communication link 16. In this fashion, the electronic controls 10 are "daisy chained". In addition, as shown in FIG. 3, the input communication link 16 of each electronic control 10 is directly connected to the output communication link 18 by the bridge 17. The physical link up between the input communication 16 and the output communication link 18 to the electronic control 10 is made by the standard RJ-11 jack.

The electronic controls 10 of the present invention are adapted to communicate with one another in the half-duplex mode. With the bridge 17 directly connecting the input communication link 16 to the output communication link 18 of each electronic control 10, the electronic controls 10 of the resent invention can communicate with one another directionally independent. Thus, each electronic control 10, when it transmits, is transmitting in both directions, i.e. along both the input communication link 16 and along the output communication link 18.

Further, as will be discussed hereinafter, a repeater 40 of the present invention, which repeats and amplifies the signal from one electronic control 10 to another, is provided between a pair of adjacent electronic controls 10. An electronic repeater 40 is needed because the RS485 standard, which controls the communication of electronic devices in the half duplex mode, requires that a driver must be able to support communication to at least 32 other devices. Since in a large building, there may be thousands of electronic controls 10, repeaters 40 are needed to sustain the signal transmission from one electronic control 10 to another electronic control 10. The plurality of electronic controls 10 can be ultimately connected to a host computer 11, such as an IBM PC or its clone equivalent.

Referring to FIG. 3, there is shown in block diagram form greater detail of the electronic control 10. The electronic control 10 comprises a power supply 42 which supplies a low DC voltage, $V_{cc}$, to the electronic components throughout the electronic control 10. The electronic control 10 also comprises an EPROM memory 44 which is in digital communication with a microprocessor 46. The microprocessor 46 can be any 8-bit processor. In the preferred embodiment, the microprocessor 46 is an Intel 8031. The microprocessor 46 is in communication with an Application Specific Integrated Circuit 48. The microprocessor 46 also receives the digital signals from the input communication link 16 received through the input buffer amplifier 50. The microprocessor 46 also provides output digital signals to the output buffer amplifier 52 to the output communication link 18. As shown in FIG. 3, there is also a bridge 17 from the input communication link 16 to the output communication link 18, bypassing the electronic control 10. Further, the input communication link 16 and the output communication link 18 are serial in format.

The ASIC 48 receives input analog signals 12 and provides the output digital control signals 14. In the preferred embodiment, eight input analog signals 12 are provided to and eight output digital control signals 14 are provided from the ASIC 48. The ASIC circuit 48 is a circuit designed partly using the cell library made available by Sierra Semiconductor Corporation of San Jose, Calif., and partly as custom designed circuitry by the same company.

Figure 4:
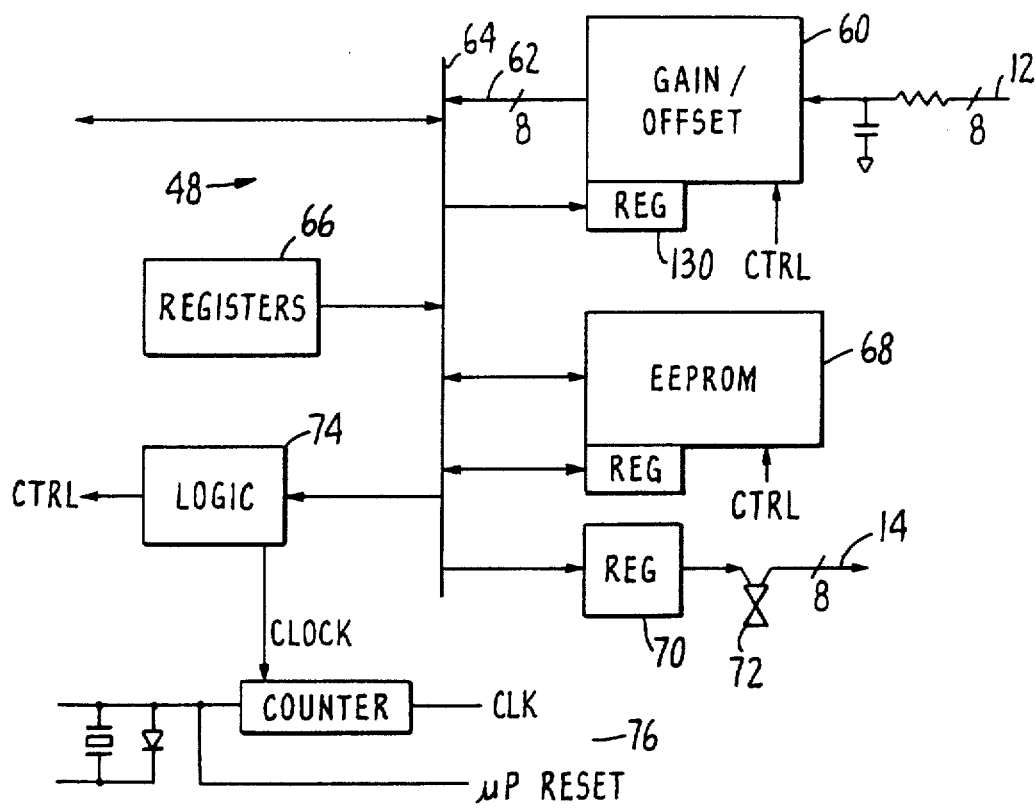
FIG. 4 is a block schematic diagram of the Application of Specific Integrated Circuit (ASIC) portion of the electronic control of the present invention.

Referring to FIG. 4, there is shown in greater schematic block diagram detail the ASIC 48. The ASIC 48 comprises a programmable gain and offset circuit 60, which will be discussed in greater detail hereinafter, which is adapted to receive the analog input signals 12. The programmable gain and offset circuit 60 amplifies and digitizes the analog input signals 12 and provides a digital signal (comprising of 8 bits) 62 to a digital data bus 64. The ASIC 48 also comprises a plurality of registers 66 which is in communication with the digital bus 64. The ASIC 48 also comprises EEPROM memory 68 which is in communication with the digital data bus 64. A plurality of output registers 70 is also in communication with the digital data bus 64. The output of the output register 70 is connected to a plurality of triacs 72 and provides the output digital control signals 14. The ASIC 48 also comprises a logic control circuit 74 in communication with the digital data bus 64. A clock circuit 76 is also contained in the ASIC 48. The digital data bus 64 of the ASIC 48 is in communication with the microprocessor 46.

Figure 5:
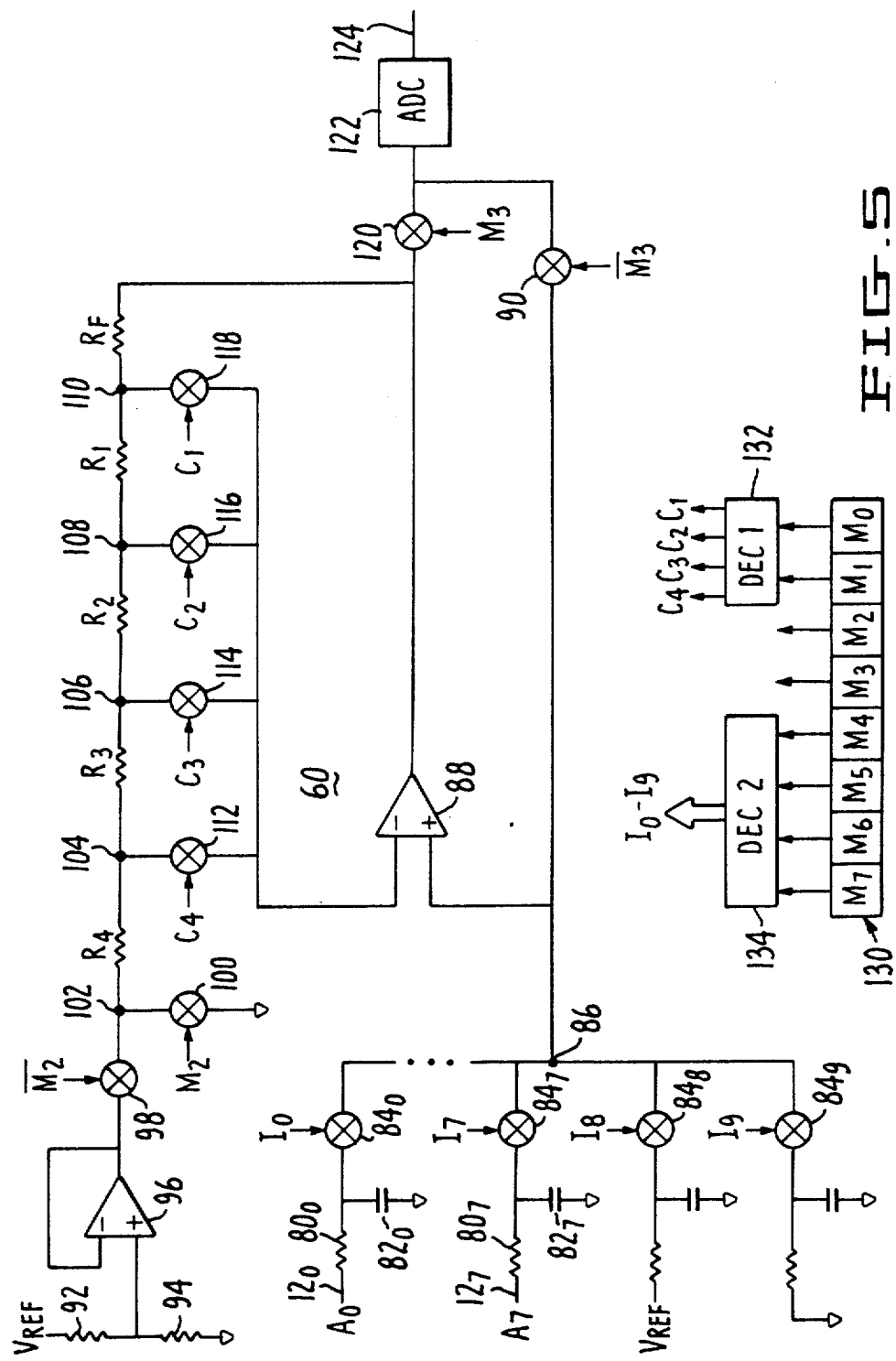
FIG. 5 is a circuit diagram of a portion of the ASIC of the electronic control of the present invention.

Referring to FIG. 5, there is shown in greater detail the programmable gain and offset circuit 60. Each of the plurality of input analog signals 12 (designated as $A_0 \ldots A_7$) is supplied to an RC filter network comprising a resistor 80 and a capacitor 82. Each of the analog input signals 12 from the RC network is then supplied to a switch 84, which will be discussed in greater detail hereinafter. Each of the switches 84 can be independently activated. Shown in FIG. 5 are the signals $I_0 \ldots I_7$ for activating switches $84_0 \ldots 84_7$, respectively. Thus, by an appropriate choice of the signal to activate the appropriate switch 84, the particular input analog signal may be chosen to pass through the switch 84 and the rest of the analog input signals 12 may be blocked by the switches 18 which are not so activated.

In addition to the eight input analog signals 12, a ninth analog signal, connected a node in an external precision resistor divider, is connected to another switch $84_8$. Finally, a tenth input signal connected to another node on the same precision divider between $V_{ref}$ and signal ground, is also passed to a switch $84_9$. These latter two switches $84_8$ and $84_9$ are each controlled by the signals $I_8$ and $I_9$, respectively. The output of all the switches $84_0 \ldots 84_9$ is connected at the node 86.

From the node 86, the selected input signal is then provided to the pins input of an operational amplifier 88. From the node 86, the selected input signal is also supplied to the switch 90 which is activated by the signal $\overline{M}_3$.

The programmable gain and offset circuit 60 also comprises an offset signal generator which comprises a resistive divider 92 and 94. In the preferred embodiment, these two resistors 92 and 94 are equal. one end of the resistor 92 is connected to $V_{ref}$. The other end of the resistor 94 is connected to ground. Thus, at the common connection of the resistors 92 and 94, $V_{ref}/2$ is the output voltage. That voltage is supplied to an operational amplifier 96 at the plus input thereof. The output of the operational amplifier 96 is also connected to the negative input. Thus, the operational amplifier 96 has unity gain. The signal $V_{ref}/2$, which is the output of the operational amplifier 96, is then supplied to yet another switch 98 which is activated by the signal $M_2$. The output of the switch 98 is also connected to the output of the switch 100 which is activated by the signal $\overline{M}_2$. The other end of the switch 100 is connected to ground. The node 102 which comprises the combined output of the switches 98 and 100 is the output of the offset signal generator.

A plurality of resistors (5, shown in FIG. 4) are connected in series with a node between each pair of adjacent resistors. As shown in FIG. 5, a string of resistors $R_4$, $R_3$, $R_2$, $R_1$ and $R_f$ are connected in series with the nodes 104, 106, 108 and 110 therebetween. The node 102 is connected to one end of the resistor $R_4$. Each of the nodes 104, 106, 108 and 110 is also connected to a switch 112, 114, 116 and 118, respectively. Each of the switches 112, 114, 116, and 118 is activated by the signals $C_4$, $C_3$, $C_2$ and $C_1$, respectively. The output of the switches 112, 114, 116, and 118 are all connected together and is supplied to the second input or the negative input to the operational amplifier 88. The other end of the resistor $R_f$ is connected to the output of the operational amplifier 88 which is supplied yet to another switch 120 which is controlled by the signal $M_3$. The output of the switch 120 is connected to the output of the switch 90 which supplies the input to a analog-to-digital converter 122. From the analog-to-digital converter 122, a digital signal 124 is provided.

Each of the switches $84_0 \ldots 84_9$, 90, 98, 100, 112, 114, 116, 118, and 120 are identical and operate in like manner and will be discussed hereinafter.

As shown in FIG. 4, the programmable gain/offset circuit 60 also comprises a register 130. The register 130 is an 8-bit register comprising the bits $M_0 \ldots M_7$ and stores the data to control the various switches. The bits $M_0$ and $M_1$ are provided to a first decoder 132 from which the signals $C_1 \ldots C_4$ are provided which control the switches 118, 116, 114 and 112, respectively. The third bit $M_2$ in register 130 controls switches 98 and 100. The fourth bit $M_3$ controls the operation of the switches 90 and 120. The last four bits $M_4 \ldots M_7$ of the register 130 are provided to a second decoder 134 which provides the control signals $I_0 \ldots I_9$. Each of those control signals $I_0 \ldots I_9$ controls the switches $84_0 \ldots 84_9$, respectively.

Figure 7:
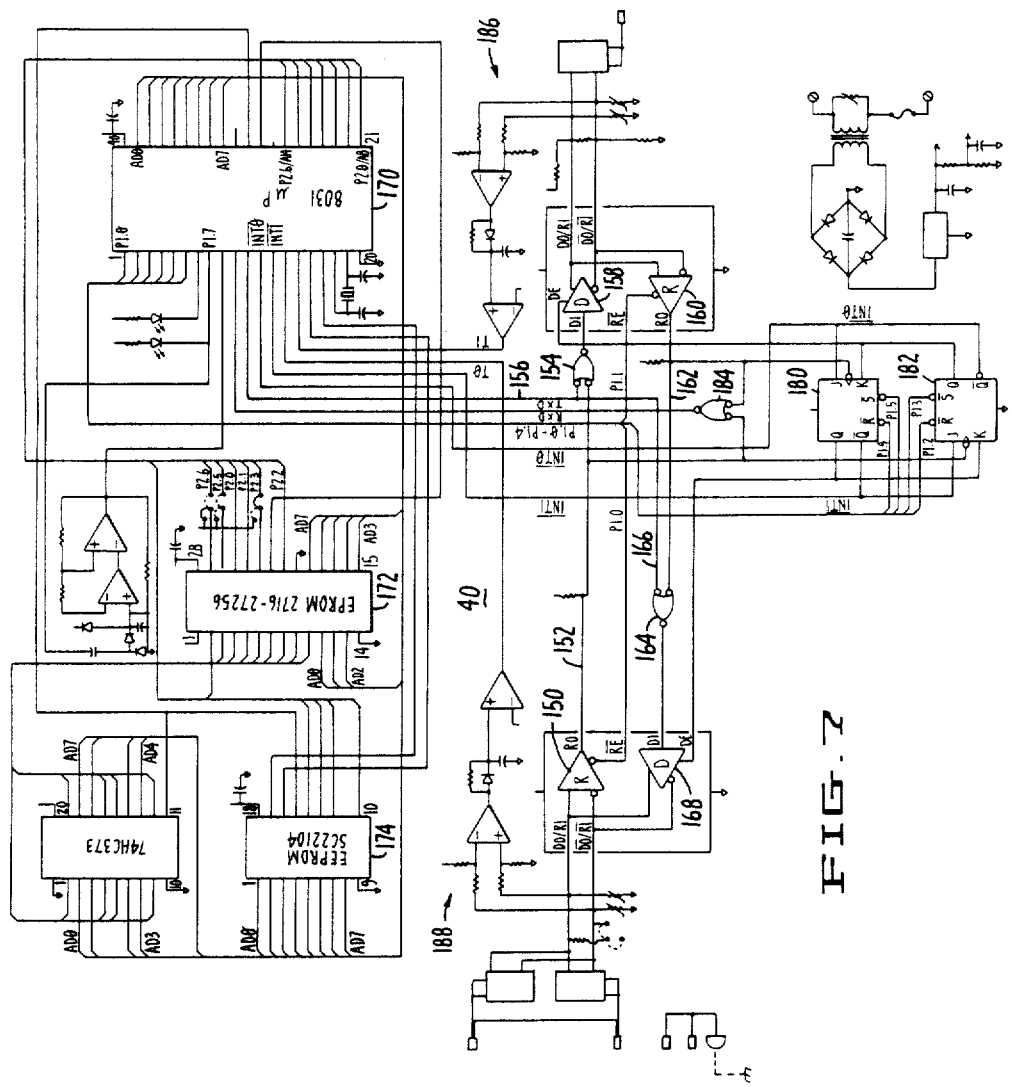
FIG. 7 is a schematic circuit diagram of a repeater of the present invention used in the electronic control system of the present invention.

Referring to FIG. 7, there is shown in schematic block diagram the repeater 40 of the present invention. The repeater 40 comprises a first receiver 150 for receiving digital signals transmitted by an electronic control 10 to one side (not shown) of the repeater 40. The first receiver 150 produces a first received signal 152 which is supplied to a first AND gate 154 (shown in FIG. 7 is a NOR gate with two inverted inputs, which is equivalent to an AND gate). A first control signal 156 is also supplied to the first AND gate 154. From the first AND gate 154, the signal is supplied to a first driver 158. The signal from the first driver 158 is then passed on to electronic controls 10 to the other side of the repeater 40.

The signals transmitted by electronic controls 10 on the other side of the repeater 40 are received by a second receiver 160. From the second receiver 160, a second received signal 162 is produced. The second received signal 162 is supplied to a second AND gate 164. A second control signal 166 is also provided as an input to the second AND gate 164. The output of the second AND gate 164 is supplied to a second driver 168. The output of the second driver 168 is supplied to electronic controls 10 to the one side of the repeater 40.

The repeater 40 also comprises a microprocessor (8031) 170. In addition, the repeater 40 also comprises EPROM memory 172 and EEPROM 174. Finally, the repeater 40 also comprises logic circuit, such as latches 180 and 182, and other well-known gates, such as OR gate 184. In addition, the repeater 40 comprises a pair of identical analog circuits 186 and 188.

Figure 8:
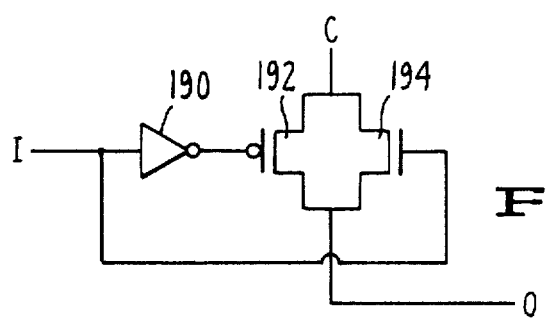
FIG. 8 is a circuit diagram of an electronic switch used in the programmable circuit shown in FIG. 5.

Each of the switches $84_0 \ldots 84_g$, 90 98, 100, 112, 114, 116, 118, and 120 is shown in FIG. 8. I is the input to the switch; O is the output thereof and C is the control signal. The switch comprises an inverter 190, a P type MOS transistor 192, and a N type MOS transistor 194 all as connected and shown in FIG. 8.

The operation of the electronic control system of the present invention and the electronic control 10 and the circuits therein will now be described. As previously stated, the electronic control 10 is adapted to control one or more remotely located apparatuses independent of the other controls and apparatuses. The electronic control 10 has a microprocessor 46 and an EPROM memory 44 which has stored therein a program for controlling the electronic control 10. A copy of the program is attached herewith as Exhibit A.

As previously discussed, the electronic control also has EEPROM memory 68 and RAM memory 66 which are contained in the ASIC 48. The RAM memory 66, being volatile (i.e., the date therein can be lost upon loss of power) is used only as a scratch memory during the computational process. The EEPROM memory 68 is used to store data and other parameters.

Because the electronic control 10 is designed to be a low-cost, high efficient unit, it is provided with a low-cost communication link system—namely, a half duplex communication system. A half-duplex system is not as expensive as a full duplex system, nor does it have the disadvantages of party line, etc. However, since in a half-duplex system, only one unit can be transmitting at any moment, it is crucial that the communication be limited solely to critical data.

In this regard, the program stored in the EPROM memory 44 for controlling the microprocessor 46 has a plurality of parameters. The entire system data base is distributed amongs the electronic controls 10 so as to unburden the host computer 11, and in fact make a host computer 11 unnecessary in many instances. Each of the parameters has a pre-set range which is stored in the EEPROM memory 68. If the electronic control 10 is unable to control the various apparatuses to bring the parameters within the pre-set range, then and only then, communication is activated by the electronic control 10 to inform other electronic controls 10 or the host computer 11 of its inability to control the parameters to within the pre-set range.

For example, if the stored program in the EPROM memory 44 is adapted to control the temperature in the zone or room 26 to the range of 70–75 degrees Fahrenheit in the daytime and 50–60 degrees Fahrenheit at night during the winter, and if, despite the motorized damper 24 being in the fully open position, the temperature is still outside of this pre-set range, than an alarm would be sent by the electronic control 10 to other electronic controls 10 or to the host computer 11 informing them or it, respectively, the failure of the electronic control 10 to achieve that control. Other electronic controls 10, responsible for controlling duct air temperature or duct air volume can then respond appropriately to correct the condition so that the electronic control 10 which triggered the alarm can bring the offending parameter under control. Other examples of control include controlling the duration of lights or other apparatuses.

This process of control, termed management by exception or communication by exception is possible only because the electronic control 10 is a self-contained control, containing microprocessor and stored program and is also desirable from the standpoint of communication bottleneck. Since the communication protocol is a half-duplex mode, it is highly undesirable for electronic controls 10 to be constantly communicating with one another or with the host to inform the host or other controls if the status quo is achieved. In the event of a failure of one of the electronic controls 10 to achieve its control, it is desirable that that status be notified to all the other electronic controls and take priority over all forms of communication. Thus, that form of communication will have the highest priority. In the electronic control system of the present invention, this is the only type of communication which is permitted. Management by exception has the highest priority.

Since the electronic control system of the present invention communicates by exception, it is also desirable that the communication lines be open 100% by the time. This is known as achieving 100% duty cycle. That is, every available slot of time is available for communication. As previously discussed, in the prior art, a half-duplex communication protocol typically employed RC circuits to time out after the last communication to ensure that there is quiescence on the communication linkages and to provide the time necessary to decide to reverse direction through the repeater. The is deprives the communication electronic control system of valuable possible time slot for electronic controls to communication with one another.

Figure 9:
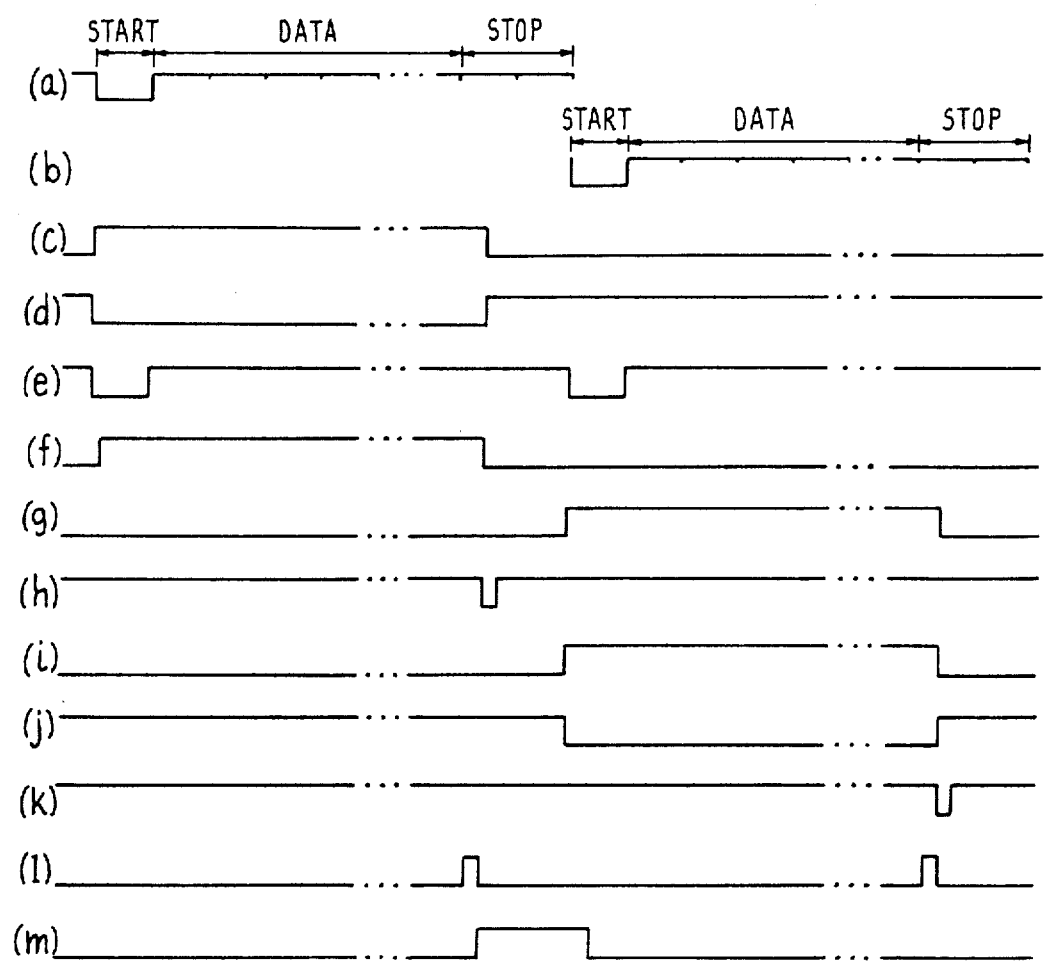
FIG. 9 is a timing diagram of the various wave forms of the communication protocol and means of direction switching used in the electronic repeater of the present invention.

In the present invention, the electronic control system communicates in the standard UART protocol. This comprises a start bit, followed by eight data bits and terminated by two stop bits. This is shown in FIG. 9.

In the repeater 40 of the present invention, during the quiescent period when there is no communication from electronic controls from either direction, both receivers 150 and 160 are enabled. Both drivers 158 and 168 are disabled. As soon as the leading edge of a start bit is received, from either direction by the respective receivers 150 or 160, the leading edge of the start bit triggers one of the J-K flip-flops (180 or 182). The output of the flip-flop 180 or 182 that is so triggered disarms the other J-K flip-flop (182 or 180), to that it cannot be triggered on. This "freezes" the direction of the transmission for the duration of that packet. The triggered flip-flop also send an interrupt signal on $\overline{INT0}$ or $\overline{INT1}$ to interrupt the microprocessor 170, informing it of the arrival of a start bit and the direction of transmission. Finally, the triggered flip-flop enables the appropriate drive so that the start bit and the subsequent data can be transmitted through the repeater 40.

For example, if a start bit is received by the receiver 150, then transmission is from the electronic controls to the "left" of the repeater 40, as shown in FIG. 7. The leading edge of the start bit from the receiver 150 is clocked into the CLOCK input of the J-K flip-flop 182. This cause $\overline{Q}$ to go low. This is sent as an interrupt to the microprocessor 170 on the $\overline{INT0}$. In addition, the $\overline{Q}$ output also disables the J input to the flip-flop 180, preventing any signal on the CLOCK input of the flip-flop 180 from triggering that flip-flop. The Q output of the J-K flip-flop 182 enables driver 158 so that data received by the receiver 150 can be transmitted therethrough.

The microprocessor 170, after it has received an interrupt, disables the receiver which did not receive the leading edge of the start bit. This further ensures that late coming data will be ignored by the repeater 40.

Data received by the repeater 40 is sent to the OR gate 184. The OR gate 184 receives the received signal from both of the receivers 150 and 160. The output of the OR gate 184 is sent to the microprocessor 170. This permits the microprocessor 170 to monitor the data received by the repeater 40 from either of the receivers 150 or 160.

When the first stop bit is received, the microprocessor 170 brings the first and second control signals 156 and 166, respectively, to low, thereby turning off the first and second AND gates 154 and 164. This terminates the transmission of any signal from either side of the repeater 40 to the other side of the repeater 40. Thereafter, the microprocessor 170 resets the flip-flops 180 and 182, which causes the output of the flip-flops to turn off the drivers 158 and 168. Finally, the microprocessor 170 enables the first receiver 150 and the second receiver 160. The repeater 40 is now in the quiescent state.

Since the next message can originate from an electronic control 10 from either direction, both receivers 150 and 160 are enabled. In this manner, the repeater 40 is able to achieve communication in the half-duplex mode in 100% duty cycle. The computer program stored in the EPROM memory 172 which controls the microprocessor 170 of the repeater 40 is shown attached as Exhibit B.

The various waveforms of the signals in the repeater 40 are shown in FIG. 9. FIG. 9(a) is the wave form of a single byte communication from left to right in the UART protocol, comprising a start bit, eight data bits and two stop bits. FIG. 9(b) is the wave form of a single byte communicating from right to left in the UART protocol. FIG. 9(c) is the Q signal output of the flip flop 182 used to enable driver 158 and to disable flip flop 180. FIG. 9(d) is the $\overline{Q}$ signal output of flip flop 182 used to disable flip flop 180 and is sent as an interrupt $\overline{INT0}$ to the microprocessor 170. FIG. 9(e) is the output of the OR gate 184. FIG. 9(f) is the signal sent to the receiver 160 at the enable terminal thereof. FIG. 9(g) is the signal sent to the receiver 150 at the enable terminal thereof. FIG. 9(h) is the signal to flip flop 182 at the reset terminal sent from the microprocessor 170. FIG. 9(i) is the Q signal output of flip flop 180 used to enable driver 168 and to disable flip flop 182. FIG. 9(j) is the $\overline{Q}$ signal output of flip flop 180 used to disable flip flop 182 and sent as an interrupt $\overline{INT1}$ to the microprocessor 170. FIG. 9(k) is the signal to flip flop 180 at the reset terminal sent from the microprocessor 170. FIG. 9(l) is the interrupt signal generated internally to the microprocessor 170 by the internal UART thereto (not shown) and sent to the microprocessor 170. FIG. 9(m) is a virtual signal showing the period of time during which both receivers are enabled and both drivers are disabled.

Since each electronic control 10 has an unique name, address, etc., which are stored in the EEPROM memory 68, peer-to-peer communication, i.e., electronic control 10 to electronic control 10 communication is possible. In addition to the name and address stored in the EPROM 68, other information such as operating schedule, communication protocol, alarm limits, alarm messages are also maintained in the EEPROM memory 68.

With respect to the programmable gain and offset circuit 60, it should be noted that the activation of the particular switch $84_0 \ldots 84_9$ activates the particular input signal to be provided to the node 86. This includes the two referenced voltages. Thus, if switch $84_8$ or $84_9$ were activated, the appropriate reference input signal may be digitized. When both reference signals are digitized, using any gain and offset conditions, the actual gain and offset can be determined, so that a subsequent measurement of the signal(s) from any of the switches $84_0 \ldots 84_7$ can be corrected for errors in gain and offset that exist at that moment for whatever the reason. The system is then calibrated "on the fly". Thus, the multiplexer comprising of the plurality of switches $84_0 \ldots 84_9$ enables the supply of a plurality of input signals including reference signal to the electronic control 10.

Figure 6:
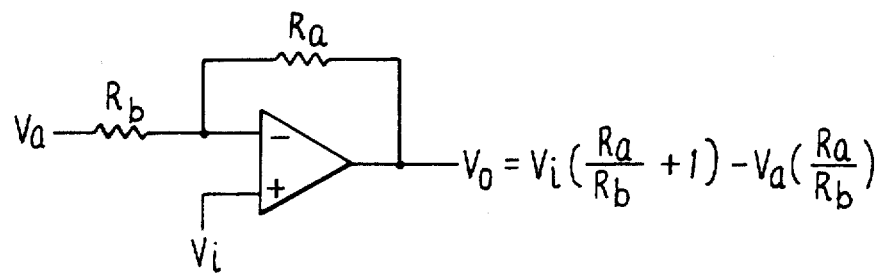
FIG. 6 is an electrical equivalent circuit of a portion of the programmable gain and offset circuit, shown in FIG. 5.

The offset signal provided at the node 102 provides an offset signal to the input signal. The offset signal is provided when the switch 98 is activated. In the event switch 98 is activated, switch 100 would be off. Conversely, if switch 100 were on, the offset would be zero since the input to the switch 100 is ground voltage. The selection of the particular switch 112, 114, 116 or 118 determines the resistance which governs the amount of gain. Referring to FIG. 6, there is shown the equivalent circuit. $R_a$ and $R_b$ are variable resistors which depend upon which of the switches 112, 114, 116 or 118 is activated. Thus, if switch 118 were on, $R_a = R_f$ and $R_b = R_4 + R_3 + R_2 + R_1$. Since the amount of gain and offset are two variables and there are two variables, $R_a$ and $R_b$, one can form two simultaneous linear equations with two unknowns. Solving for $R_a$ and $R_b$ depending for the gain and offset would provide solution to which of the switches 112, 114, 116, 118 and 98 and 100 would be activated.

There are many advantages to the electronic control system, electronic control, repeater, programmable gain and offset circuits of the present invention. First and foremost is that each control within the electronic control system is a self-contained control unit having a computer and a stored program. All the data needed at any time by that electronic control 10 is contained within the EEPROM as a "distributed" data base. Communication among the electronic controls and to the host unit is via half-duplex mode with communication by exception being the mode of protocol. Further with the repeater of the present invention, the half-duplex communication protocol can be operated in 100% duty cycle. Finally, the programmable gain and offset circuit of the present invention offers great flexibility in fine-tuning the input analog signal and offers the ability for the electronic control 10 to calibrate itself "on the fly" with two input reference signals.

What is claimed is:

1. An electronic control system for controlling a plurality of remotely located apparatuses, said system comprising:

a plurality of like electronic controls, each control having a computer means with a stored program having a plurality of parameters each having a pre-set range;

each of said controls for receiving an input signal and for providing a control signal for controlling one of said apparatuses, independent of said other controls and apparatuses;

asynchronous communication link means for transmitting data asynchronously without regard to data content from each control to other controls in a half duplex mode;

means for controlling said communication link means to operate with one hundred percent (100%) duty cycle; and each control having means for communicating to other controls only in the event one of said parameters exceeds its preset range.

2. The system of claim 1 wherein said controlling means further comprises:

a first receiver means for receiving a first signal from one of said digital devices and for providing a first received signal;

a first gate means for receiving said first received signal and a first control signal, and for providing a first output signal;

a first driver means for receiving said first output signal and for providing a first transmitted signal to said other digital device;

a second receiver means for receiving a second signal from said second digital device, and for providing a second received signal;

a second gate means for receiving said second received signal and a second control signal, and for providing a second output signal;

a second driver means for receiving said second output signal and for providing a second transmitted signal to said one digital device;

means for determining the end of transmission of said first or said second signal;

means for generating said first and said second control signals in response to said determining means detecting the end of transmission;

means for enabling said first and second receiver means; and means for enabling said first or second driver means in response to said first or second signal received.

3. An electronic control system for controlling a plurality of remotely located apparatuses, said system comprising:

a plurality of like electronic controls, each control for receiving an input signal and for providing a control signal for controlling one of said apparatuses, independent of said other controls and apparatuses;

asynchronous communication link means for transmitting data asynchronously without regard to data content from each control to other controls in a half duplex mode; and means for controlling said communication link means to operate with one hundred percent (100%) duty cycle.

4. The system of claim 3 wherein said controlling means further comprises:

a first receiver means for receiving a first signal from one of said digital devices and for providing a first received signal;

a first gate means for receiving said first received signal and a first control signal, and for providing a first output signal;

a first driver means for receiving said first output signal and for providing a first transmitted signal to said other digital device;

a second receiver means for receiving a second signal from said other digital device, and for providing a second received signal;

a second gate means for receiving said second received signal and a second control signal, and for providing a second output signal;

a second driver means for receiving said second output signal and for providing a second transmitted signal to said one digital device;

means for determining the end of transmission of said first or said second signal;

means for generating said first and said second control signals in response to said determining means detecting the end of transmission;

means for enabling said first and second receiver means; and means for enabling said first or second driver means in response to said first or second signal received.

5. An electronic control for controlling an apparatus, and for communication with other devices, comprising:

a computer means having a stored program, having a plurality of parameters, each having a pre-set range;

means for receiving an input signal and for providing a control signal for controlling said apparatus;

asynchronous means for communicating data asynchronously without regard to data content to said other devices in a half-duplex mode with one hundred percent (100%) duty cycle; and means for activating said communicating means only in the event one of said parameters exceeds its pre-set range.

6. An electronic repeater for controlling the communication between two digital electronic devices communicating data asynchronously without regard to data content in a half-duplex mode, said repeater comprising:

a first receiver means for receiving a first signal from one of said digital devices and for providing a first received signal;

a first gate means for receiving said first received signal and a first control signal, and for providing a first output signal;

a first driver means for receiving said first output signal and for providing a first transmitted signal to said other digital device;

a second receiver means for receiving a second signal from said other digital device, and for providing a second received signal;

a second gate means for receiving said second received signal and a second control signal, and for providing a second output signal;

a second driver means for receiving said second output signal and for providing a second transmitted signal to said one digital device;

means for determining the end of transmission of said first or second signal;

means for generating said first and second control signals, in response to said determining means detecting the end of transmission;

means for enabling said first and second receiver means; and means for enabling said first or said second driver means in response to said first or second signal received.

* * * * *